United States Patent
Bi et al.

(10) Patent No.: US 12,238,946 B2
(45) Date of Patent: Feb. 25, 2025

(54) PEROVSKITE/SILICON HETEROJUNCTION TANDEM SOLAR CELL AND PREPARATION METHOD THEREOF

(71) Applicant: Advanced Solar Technology Institute, Xuancheng, Anhui (CN)

(72) Inventors: Enbing Bi, Anhui (CN); Ted Tie Guo, Anhui (CN); Qiankai Ba, Anhui (CN)

(73) Assignee: Advanced Solar Technology Institute, Xuancheng, Anhui (CN)

( * ) Notice: Subject to any disclaimer, the term of this patent is extended or adjusted under 35 U.S.C. 154(b) by 0 days.

(21) Appl. No.: 18/556,676

(22) PCT Filed: Mar. 15, 2023

(86) PCT No.: PCT/CN2023/081524
§ 371 (c)(1),
(2) Date: Oct. 23, 2023

(87) PCT Pub. No.: WO2023/185464
PCT Pub. Date: Oct. 5, 2023

(65) Prior Publication Data
US 2024/0244853 A1 Jul. 18, 2024

(30) Foreign Application Priority Data
Mar. 29, 2022 (CN) .................... 202210319630.X

(51) Int. Cl.
*H10K 30/57* (2023.01)
*H10K 30/10* (2023.01)
(Continued)

(52) U.S. Cl.
CPC ............. *H10K 30/57* (2023.02); *H10K 30/10* (2023.02); *H10K 30/40* (2023.02); *H10K 30/85* (2023.02); *H10K 71/15* (2023.02); *H10K 85/50* (2023.02)

(58) Field of Classification Search
CPC ........ H10K 30/57; H10K 30/85; H10K 30/40; H10K 30/10; H10K 71/15; H10K 85/50
See application file for complete search history.

(56) References Cited

U.S. PATENT DOCUMENTS

2023/0074348 A1* 3/2023 Wu ................... H01L 31/03125

FOREIGN PATENT DOCUMENTS

| CN | 107564989 | 1/2018 |
| CN | 111987184 | 11/2020 |

(Continued)

OTHER PUBLICATIONS

Wang et al., "Cross-linked hole transport layers for high-efficiency perovskite tandem solar cells", Sci China Chem, Nov. 2021 vol. 64 No. 11. (Year: 2021).*

(Continued)

*Primary Examiner* — Tae-Sik Kang
(74) *Attorney, Agent, or Firm* — JCIPRNET

(57) ABSTRACT

The present invention relates to the technical field of solar cells, and particularly relates to a perovskite/silicon heterojunction tandem solar cell and a preparation method thereof. The solar cell includes a silicon-based sub-cell and a perovskite sub-cell laminated on the silicon-based sub-cell, where intermediate layers or recombination junctions formed by a p-type heavily-doped amorphous silicon layer and an n-type heavily-doped amorphous silicon layer are arranged between the silicon-based sub-cell and the perovskite sub-cell. According to the present invention, through the use of the p-type heavily-doped amorphous silicon layer and the n-type heavily-doped amorphous silicon layer as a carrier recombination junction, on the one hand, the preparation and equipment costs are greatly reduced, and on the other hand, the photocurrent density and conversion efficiency of the tandem cell can be improved.

4 Claims, 1 Drawing Sheet

(51) Int. Cl.
*H10K 30/40* (2023.01)
*H10K 30/85* (2023.01)
*H10K 71/15* (2023.01)
*H10K 85/50* (2023.01)

(56) References Cited

FOREIGN PATENT DOCUMENTS

| | | | |
|---|---|---|---|
| CN | 213150795 | 5/2021 | |
| CN | 113257940 | 8/2021 | |
| CN | 113690340 | 11/2021 | |
| CN | 113782566 | 12/2021 | |
| CN | 215680694 | 1/2022 | |
| CN | 114792704 | 7/2022 | |
| WO | WO-2021159728 A1 * | 8/2021 | ....... H01L 31/03125 |

OTHER PUBLICATIONS

"International Search Report (Form PCT/ISA/210) of PCT/CN2023/081524", mailed on Apr. 28, 2023, pp. 1-3.
"Written Opinion of the International Searching Authority (Form PCT/ISA/237) of PCT/CN2023/081524", mailed on Apr. 28, 2023, pp. 1-4.

* cited by examiner

PEROVSKITE/SILICON HETEROJUNCTION TANDEM SOLAR CELL AND PREPARATION METHOD THEREOF

CROSS-REFERENCE TO RELATED APPLICATION

This application is a 371 application of International PCT application serial no. PCT/CN2023/081524 filed on Mar. 15, 2023, which claims the priority benefit of China application no. 202210319630.X filed on Mar. 29, 2022. The entirety of each of the above mentioned patent applications is hereby incorporated by reference herein and made a part of this specification.

TECHNICAL FIELD

The present invention relates to the technical field of solar cells, and particularly relates to a perovskite/silicon heterojunction tandem solar cell and a preparation method thereof.

DESCRIPTION OF RELATED ART

Perovskite solar cells have the advantages of high absorption coefficient (105 cm$^{-1}$), high open circuit voltage (>1.2 eV), adjustable bandgap (1.2-2.3 eV), being applicable in a tandem structure, and being suitable for preparation by solution method, and the like. During more than ten years of research and development of perovskite solar cells since 2009, the efficiency of a single cell has constantly broken records and increased from 3.8% to 25.5%, and the stability has lasted from a few minutes at the beginning to thousands of hours. Silicon-based heterojunction solar cells have the characteristics of high conversion efficiency, high long-wave spectral response, and the like, and now the efficiency has reached 25% or more.

Although a single solar cell has achieved an efficiency of 25% or more, a photoelectric conversion material used in any type of solar cells is single, and the theoretical efficiency is determined by its band gap and has a theoretical efficiency limit. The theoretical efficiency limit of a single perovskite cell is 33%, and the theoretical efficiency limit of a heterojunction crystalline silicon solar cell is 29%. This is because that the energy distribution in the sunlight spectrum is wide, and any existing material can only absorb photons with energy higher than its energy band value. Therefore, photons with less energy in sunlight will pass through the cell, and are then absorbed by back electrode metals to be converted into heat energy; while the excess energy of some other high-energy photons beyond the band gap will excite phonons and become heat loss, that is to say, high-energy photons cannot be fully utilized. These energy losses limit the efficiency of solar cells.

However, series connection of solar cells with different bandgap widths from top to bottom according to the logic of bandgap width size to form a multijunction tandem cell is the best technical solution to overcome low-energy and high-energy losses, and also the most direct means to break through the photoelectric conversion efficiency of a single cell. High photoelectric conversion efficiencies higher than 40% can be theoretically achieved by using perovskite and silicon-based heterojunction tandem solar cell devices. A common two-terminal perovskite/heterojunction silicon tandem solar cell generally takes transparent metal oxide conductive layers as intermediate layers (or recombination layers, tunnel layers) of a top perovskite solar cell and a bottom heterojunction silicon solar cell; for example, in Chinese patent CN 215680694 U, a tunnel junction 108 is made of ITO, IZO, AZO, IWO, ICO or other transparent film materials; and in patent CN 213150795 U, transparent conductive layers and heavily-doped silicon layers are taken as intermediate recombination layers, so that on the one hand, the preparation and equipment costs will be increased, and on the other hand, absorption of metal oxides on near-infrared spectrum is relatively large, which will affect the photocurrent of silicon cells. Therefore, it is necessary to develop a new recombination layer to improve the photocurrent of tandem cells, so as to solve the above-mentioned technical problems existing in the prior art.

SUMMARY

In view of the forgoing, an objective of the present invention is to provide a perovskite/silicon heterojunction tandem solar cell and a preparation method thereof, to solve the problem that perovskite tandem solar cells are low in photoelectric conversion efficiency.

Based on the above objective, the present invention provides a perovskite/silicon heterojunction tandem solar cell, including a silicon-based sub-cell and a perovskite sub-cell laminated on the silicon-based sub-cell, where intermediate layers or recombination junctions formed by a p-type heavily-doped amorphous silicon layer and an n-type heavily-doped amorphous silicon layer are arranged between the silicon-based sub-cell and the perovskite sub-cell.

The p-type heavily-doped amorphous silicon layer has a thickness of 1-30 nm and a doping concentration of $10^{18}$-$10^{20}$ cm$^{-3}$; and the n-type heavily-doped amorphous silicon layer has a thickness of 1-30 nm and a doping concentration of $10^{18}$-$10^{20}$ cm$^{-3}$.

The tandem solar cell is of an n-i-p tandem structure in which the silicon-based sub-cell includes a first metal electrode, a first transparent conductive layer, an n-type doped amorphous silicon layer, a first intrinsic amorphous silicon layer, an N-type monocrystalline silicon layer and a second intrinsic amorphous silicon layer that are laminated sequentially from bottom to top, the perovskite sub-cell includes a first electron transport layer, a second electron transport layer, a perovskite absorber layer, a first hole transport layer, a second hole transport layer, a second transparent conductive layer and a second metal electrode layer that are laminated sequentially from bottom to top, and the intermediate layers or recombination junctions are a p-type heavily-doped amorphous silicon layer and an n-type heavily-doped amorphous silicon layer that are laminated between the second intrinsic amorphous silicon layer and the first electron transport layer sequentially from bottom to top.

The tandem solar cell is of a p-i-n tandem structure in which the silicon-based sub-cell includes a first metal electrode, a first transparent conductive layer, a p-type doped amorphous silicon layer, a first intrinsic amorphous silicon layer, an N-type monocrystalline silicon layer and a second intrinsic amorphous silicon layer that are laminated sequentially from bottom to top, the perovskite sub-cell includes a first hole transport layer, a second hole transport layer, a perovskite absorber layer, a first electron transport layer, a second electron transport layer, a second transparent conductive layer and a second metal electrode layer that are laminated sequentially from bottom to top, and the intermediate layers or recombination junctions are an n-type heavily-doped amorphous silicon layer and a p-type heavily-doped amorphous silicon layer that are laminated between the second intrinsic amorphous silicon layer and the first hole transport layer sequentially from bottom to top.

The first transparent conductive layer and the second transparent conductive layer are preferably transparent metal oxide conductive layers.

The first metal electrode and the second metal electrode are made of one or more of silver, copper, gold, aluminum, palladium, titanium, chromium, and nickel; and the first transparent conductive layer and the second transparent conductive layer are both transparent metal oxide conductive layers made of one or more of indium tin oxide (ITO), indium wolfram oxide (IWO), fluorine-doped tin oxide (FTO), indium zinc oxide (IZO) and aluminum-doped zinc oxide (AZO).

The first hole transport layer and/or the second hole transport layer is made of a p-type semiconductor material; and the first electron transport layer and/or the second electron transport layer is made of an n-type semiconductor material.

Optionally, the first hole transport layer and/or the second hole transport layer is made of one or more of nickel oxide, molybdenum oxide, cuprous oxide, copper iodide, copper phthalocyanine, cuprous thiocyanate, reduced graphene oxide, poly[bis(4-phenyl)(2,4,6-trimethylphenyl)amine] (P-TAA), 2,2',7,7'-tetrakis[N,N-di(4-methoxyphenyl)amino]-9,9'-spirobifluorene (Spiro-OMeTAD), poly[bis(4-phenyl)(4-butylphenyl)amine] (Poly-TPD), poly(3-hexylthiophene-2,5-diyl) (P3HT), N2,N2,N2',N2',N7,N7,N7',N7'-octa(4-methoxyphenyl)spiro[fluorene-9,9'-xanthene]-2,2',7,7'-tetraamine (X60), N2,N7-bis(4-methoxyphenyl)-N2,N7-bis(2-spiro[fluorene-9,9'-xanthene])-spiro[fluorene-9,9'-xanthene]-2,7-diamine (X55), poly(3,4-ethylenedioxythiophene)-poly(styrenesulfonate) (PEDOT:PSS), 2,2,7,7-tetrakis(N,N-di-p-tolyl)amino-9,9-spirobifluorene (Spiro-TTB), and polyvinylcarbazole (PVK).

Optionally, the first electron transport layer and/or the second electron transport layer is made of one or more of titanium oxide ($TiO_2$), tin oxide ($SnO_2$), zinc oxide (ZnO), zinc tin oxide ($Zn_2SnO_4$), fullerene (C60), graphene and fullerene derivatives.

The material of the perovskite absorber layer is of an $ABX_3$ structure consisting of corner-sharing $BX_6$ octahedra and A cations located in voids thereof, where A is a monovalent cation; B is a divalent cation; and X is a halogen anion. A is preferably one or more of MA, FA, Cs or Rb, B is preferably Pb, and X is preferably one or more of halogens I, Br, and Cl or pseudo-halogens such as SCN, $BF_4$, $PF_6$, etc.; and the bandgap of the perovskite sub-cell ranges from 1.5 eV to 1.85 eV.

The present invention further provides a method for preparing the perovskite/silicon heterojunction tandem solar cell, which includes a preparation method of the n-i-p tandem structure and a preparation method of the p-i-n tandem structure, where the preparation method of the n-i-p tandem structure includes the following steps:
(1) carrying out surface texturing treatment on an N-type crystalline silicon wafer;
(2) carrying out passivation on both sides of the N-type crystalline silicon wafer, and growing a first intrinsic amorphous silicon layer and a second intrinsic amorphous silicon layer on both sides of the passivated N-type crystalline silicon wafer by PECVD;
(3) growing a p-type heavily-doped amorphous silicon layer and an n-type heavily-doped amorphous silicon layer on the second intrinsic amorphous silicon layer sequentially;
(4) growing an n-type doped amorphous silicon layer on one side of the first intrinsic amorphous silicon layer away from the N-type crystalline silicon wafer;
(5) growing a first electron transport layer and a second electron transport layer on the surface of the n-type heavily-doped amorphous silicon layer;
(6) preparing a perovskite absorber layer on the second electron transport layer;
(7) preparing a first hole transport layer and a second hole transport layer on the perovskite absorber layer sequentially;
(8) preparing a first transparent conductive layer on one side of the n-type doped amorphous silicon layer away from the first intrinsic amorphous silicon layer, and preparing a second transparent conductive layer on the second hole transport layer; and
(9) preparing a metal electrode layer on the surfaces of the first transparent conductive layer and the second transparent conductive layer respectively;

The preparation method of the p-i-n tandem structure includes the following steps:
(1) carrying out surface texturing treatment on an N-type crystalline silicon wafer;
(2) carrying out passivation on both sides of the N-type crystalline silicon wafer, and growing a first intrinsic amorphous silicon layer and a second intrinsic amorphous silicon layer on both sides of the passivated N-type crystalline silicon wafer by PECVD;
(3) growing an n-type heavily-doped amorphous silicon layer and a p-type heavily-doped amorphous silicon layer on the second intrinsic amorphous silicon layer sequentially;
(4) growing a p-type doped amorphous silicon layer on one side of the first intrinsic amorphous silicon layer away from the N-type crystalline silicon wafer;
(5) growing a first hole transport layer and a second hole transport layer on the surface of the p-type heavily-doped amorphous silicon layer;
(6) preparing a perovskite absorber layer on the second hole transport layer;
(7) preparing a first electron transport layer and a second electron transport layer on the perovskite absorber layer sequentially;
(8) preparing a first transparent conductive layer on one side of the p-type doped amorphous silicon layer away from the first intrinsic amorphous silicon layer, and preparing a second transparent conductive layer on the second electron transport layer; and
(9) preparing a metal electrode layer on the surfaces of the first transparent conductive layer and the second transparent conductive layer respectively.

Preparation methods of the first hole transport layer, the second hole transport layer, the first electron transport layer and the second electron transport layer are physical deposition methods or chemical deposition methods, where the physical deposition methods include vacuum evaporation, sputtering, ion beam deposition and pulsed laser deposition; and the chemical deposition methods include chemical vapor deposition, atomic layer deposition, spin coating, slot coating and doctor blade.

Preparation methods of the first transparent conductive layer and the second transparent conductive layer include vacuum evaporation, sputtering, ion beam deposition and pulsed laser deposition.

A preparation method of the perovskite absorber layer is a physical deposition method and/or a chemical deposition method, where the physical deposition method includes vacuum evaporation, and the chemical deposition method includes chemical vapor deposition, spin coating, slot coating and doctor blade.

Beneficial effects of the invention: in the perovskite/silicon heterojunction tandem solar cell of the present invention, instead of taking transparent metal oxide conductive layers as intermediate layers (or recombination layers, tunnel layers) of a top perovskite solar cell and a bottom heterojunction silicon solar cell, a p-type heavily-doped amorphous silicon layer and an n-type heavily-doped amorphous silicon layer are used as carrier recombination junctions. On the one hand, the preparation and equipment costs are greatly reduced, and on the other hand, the photocurrent density and conversion efficiency of the tandem cell can be improved.

BRIEF DESCRIPTION OF THE DRAWINGS

To illustrate the technical solutions in the present invention or the prior art more clearly, the following briefly introduces the drawings required to be used in the description of the embodiments or the prior art. Apparently, the drawings in the following description are only used to show the present invention, and other drawings can also be obtained from these drawings by those of ordinary skill in the art without creative efforts.

REFERENCE NUMERALS

1: first metal electrode; 2: first transparent conductive layer; 3: n-type heavily-doped amorphous silicon layer; 4: first intrinsic amorphous silicon layer; 5: N-type monocrystalline silicon layer; 6: n-type heavily-doped amorphous silicon layer; 7: first hole transport layer; 8: second hole transport layer; 9: perovskite absorber layer; 10: first electron transport layer; 11: second electron transport layer; 12: second intrinsic amorphous silicon layer; 13: second transparent conductive layer; 14: second metal electrode; 31: p-type doped amorphous silicon layer; and 32: n-type doped amorphous silicon layer.

DESCRIPTION OF THE EMBODIMENTS

In order to make the objective, technical solutions and advantages of the present invention clearer, the present invention will be further described in detail below with reference to specific embodiments.

It should be noted that, unless otherwise defined, the technical or scientific terms used in the present invention shall have the usual meanings understood by those of ordinary skill in the art to which the present invention belongs. The words such as "first," "second" and the like used herein do not imply any order, quantity, or importance, but are merely used to distinguish different components. The words "comprise" or "include" and the like mean that a component or object appearing before the word covers components or objects listed after the word and equivalents thereof, and does not exclude other components or objects. The words such as "connect" or "connected" and the like are not limited to physical or mechanical connections, but may include electrical connections, whether direct or indirect.

The words such as "upper", "lower", "left", "right", etc. are only used to represent relative positional relationships, and when the absolute position of the described object changes, the relative positional relationship may also change accordingly.

The present invention relates to a perovskite/silicon heterojunction tandem solar cell, including a silicon-based sub-cell and a perovskite sub-cell laminated on the silicon-based sub-cell, where intermediate layers or recombination junctions formed by a p-type heavily-doped amorphous silicon layer and an n-type heavily-doped amorphous silicon layer are arranged between the silicon-based sub-cell and the perovskite sub-cell. Through the use of the p-type heavily-doped amorphous silicon layer and the n-type heavily-doped amorphous silicon layer as carrier recombination junctions, on the one hand, the preparation and equipment costs are greatly reduced, and on the other hand, the photocurrent density and conversion efficiency of the tandem cell can be improved.

Figure 1:
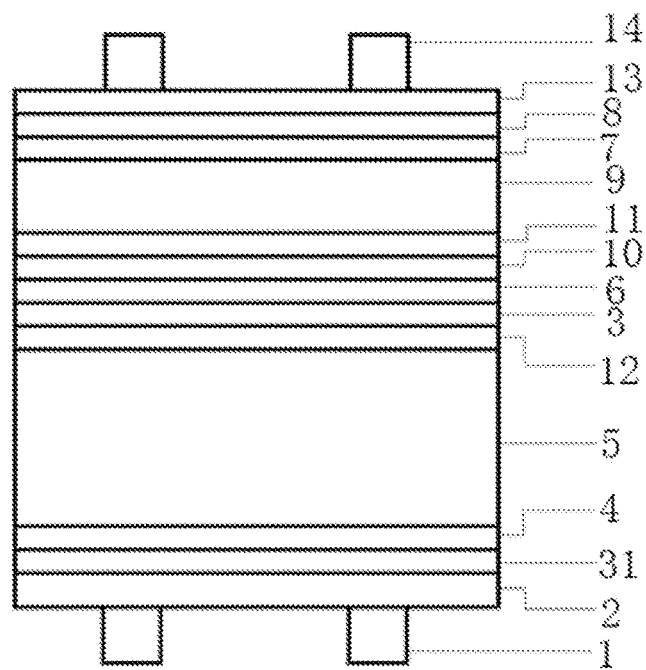
FIG. 1 is a schematic diagram of an n-i-p tandem structure of a perovskite/silicon heterojunction tandem solar cell according to the present invention.

As shown in FIG. 1, the perovskite/silicon heterojunction tandem solar cell is of an n-i-p tandem structure including a first metal electrode, a first transparent conductive layer, an n-type doped amorphous silicon layer, a first intrinsic amorphous silicon layer, an N-type monocrystalline silicon, a second intrinsic amorphous silicon layer, a p-type heavily-doped amorphous silicon layer, an n-type heavily-doped amorphous silicon layer, a first electron transport layer, a second electron transport layer, a perovskite absorber layer, a first hole transport layer, a second hole transport layer, a second transparent conductive layer and a second metal electrode layer that are laminated sequentially from bottom to top.

A preparation method of the n-i-p tandem structure includes the following steps:

(1) surface texturing treatment is carried out on an N-type crystalline silicon wafer;

(2) passivation is carried out on both sides of the N-type crystalline silicon wafer, and a first intrinsic amorphous silicon layer and a second intrinsic amorphous silicon layer are grown on both sides of the passivated N-type crystalline silicon wafer by PECVD;

(3) a p-type heavily-doped amorphous silicon layer and an n-type heavily-doped amorphous silicon layer are grown on the second intrinsic amorphous silicon layer sequentially;

(4) an n-type doped amorphous silicon layer is grown on one side of the first intrinsic amorphous silicon layer away from the N-type crystalline silicon wafer;

(5) a first electron transport layer and a second electron transport layer are grown on the surface of the n-type heavily-doped amorphous silicon layer;

(6) a perovskite absorber layer is prepared on the second electron transport layer;

(7) a first hole transport layer and a second hole transport layer are prepared on the perovskite absorber layer sequentially;

(8) a first transparent conductive layer is prepared on one side of the n-type doped amorphous silicon layer away from the first intrinsic amorphous silicon layer, and a second transparent conductive layer is prepared on the second hole transport layer; and (9) a metal electrode layer is respectively prepared on the surfaces of the first transparent conductive layer and the second transparent conductive layer.

Figure 2:
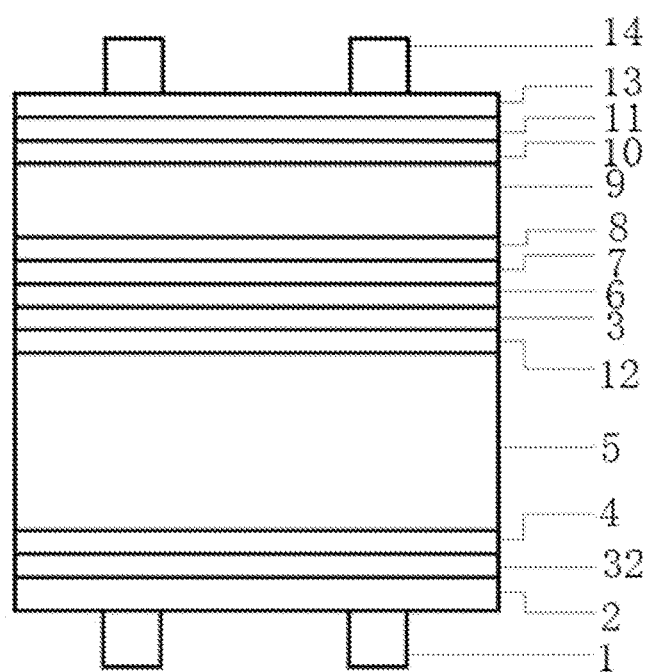
FIG. 2 is a schematic diagram of a p-i-n tandem structure of the perovskite/silicon heterojunction tandem solar cell according to the present invention.

As shown in FIG. 2, the tandem solar cell is of a p-i-n tandem structure including a first metal electrode, a first transparent conductive layer, a p-type doped amorphous silicon layer, a first intrinsic amorphous silicon layer, an N-type monocrystalline silicon, a second intrinsic amorphous silicon layer, an n-type heavily-doped amorphous silicon layer, a p-type heavily-doped amorphous silicon layer, a first hole transport layer, a second hole transport layer, a perovskite absorber layer, a first electron transport layer, a second electron transport layer, a second transparent conductive layer and a second metal electrode layer that are laminated sequentially from bottom to top.

A preparation method of the p-i-n tandem structure includes the following steps:

(1) surface texturing treatment is carried out on an N-type crystalline silicon wafer;
(2) passivation is carried out on both sides of the N-type crystalline silicon wafer, and a first intrinsic amorphous silicon layer and a second intrinsic amorphous silicon layer are grown on both sides of the passivated N-type crystalline silicon wafer by PECVD;
(3) an n-type heavily-doped amorphous silicon layer and a p-type heavily-doped amorphous silicon layer are grown on the second intrinsic amorphous silicon layer sequentially;
(4) a p-type doped amorphous silicon layer is grown on one side of the first intrinsic amorphous silicon layer away from the N-type crystalline silicon wafer;
(5) a first hole transport layer and a second hole transport layer are grown on the surface of the p-type heavily-doped amorphous silicon layer;
(6) a perovskite absorber layer is prepared on the second hole transport layer;
(7) a first electron transport layer and a second electron transport layer are prepared on the perovskite absorber layer sequentially;
(8) a first transparent conductive layer is prepared on one side of the p-type doped amorphous silicon layer away from the first intrinsic amorphous silicon layer, and a second transparent conductive layer is prepared on the second electron transport layer; and
(9) a metal electrode layer is respectively prepared on the surfaces of the first transparent conductive layer and the second transparent conductive layer.

As a preferred embodiment, the first metal electrode and the second metal electrode are same metal electrodes. The first intrinsic amorphous silicon layer and the second intrinsic amorphous silicon layer are same intrinsic amorphous silicon layers. The first transparent conductive layer and the second transparent conductive layer are same transparent metal oxide conductive layers.

The p-type heavily-doped amorphous silicon layer has a thickness of 1-30 nm and a doping concentration of $10^{18}$-$10^{20}$ cm$^{-3}$; and the n-type heavily-doped amorphous silicon layer has a thickness of 1-30 nm and a doping concentration of $10^{18}$-$10^{20}$ cm$^{-3}$.

The metal electrodes are made of one or more of silver, copper, gold, aluminum, palladium, titanium, chromium, and nickel; the transparent metal oxide conductive layers are made of one or more of indium tin oxide (ITO), indium wolfram oxide (IWO), fluorine-doped tin oxide (FTO), indium zinc oxide (IZO) and aluminum-doped zinc oxide (AZO).

The first hole transport layer and/or the second hole transport layer is made of a p-type semiconductor material; and the first electron transport layer and/or the second electron transport layer is made of an n-type semiconductor material.

Optionally, the first hole transport layer and/or the second hole transport layer is made of one or more of nickel oxide, molybdenum oxide, cuprous oxide, copper iodide, copper phthalocyanine, cuprous thiocyanate, reduced graphene oxide, poly[bis(4-phenyl)(2,4,6-trimethylphenyl)amine] (P-TAA), 2,2',7,7'-tetrakis[N,N-di(4-methoxyphenyl)amino]-9,9'-spirobifluorene (Spiro-OMeTAD), poly[bis(4-phenyl)(4-butylphenyl)amine] (Poly-TPD), poly(3-hexylthiophene-2,5-diyl) (P3HT), N2,N2,N2',N2',N7,N7,N7',N7'-octa(4-methoxyphenyl)spiro[fluorene-9,9'-xanthene]-2,2',7,7'-tetraamine (X60), N2,N7-bis(4-methoxyphenyl)-N2,N7-bis(2-spiro[fluorene-9,9'-xanthene])-spiro[fluorene-9,9'-xanthene]-2,7-diamine (X55), poly(3,4-ethylenedioxythiophene)-poly(styrenesulfonate) (PEDOT:PSS), 2,2,7,7-tetrakis(N,N-di-p-tolyl)amino-9,9-spirobifluorene (Spiro-TTB), and polyvinylcarbazole (PVK).

Optionally, the first electron transport layer and/or the second electron transport layer is made of one or more of titanium oxide ($TiO_2$), tin oxide ($SnO_2$), zinc oxide (ZnO), zinc tin oxide ($Zn_2SnO_4$), fullerene (C60), graphene and fullerene derivatives.

The material of the perovskite absorber layer is of an $ABX_3$ structure consisting of corner-sharing $BX_6$ octahedra and A cations located in voids thereof, where A is a monovalent cation; B is a divalent cation; and X is a halogen anion. A is preferably one or more of MA, FA, Cs or Rb, B is preferably Pb, and X is preferably one or more of halogens I, Br and Cl or pseudo-halogens such as SCN, $BF_4$, $PF_6$, etc.; and the bandgap of the perovskite sub-cell ranges from 1.5 eV to 1.85 eV.

The following description will be given by means of specific examples.

Example 1

Preparation of an n-i-p Perovskite/Silicon Heterojunction Tandem Cell

Firstly, an N-type silicon wafer of commercial-grade M6, having a resistivity of 1-10 Ω·cm and a thickness of 150-200 µm, was used. The N-type silicon wafer was subjected to polishing, texturing and cleaning treatments sequentially, and an intrinsic amorphous silicon passivation layer (thickness: 5 nm) was deposited on both sides of the silicon wafer by PECVD, a doped (doping concentration: $10^{19-20}$ cm$^{-3}$) n-type heavily-doped amorphous silicon (thickness: 10 nm) was prepared on the back side of the silicon wafer, a doped (doping concentration: $10^{19-20}$ cm$^{-3}$) p-type heavily-doped amorphous silicon (thickness: 10 nm) and n-type heavily-doped amorphous silicon (thickness: 10 nm) were prepared on the front side of the silicon wafer so as to form a tunnel junction, and ITO (100 nm) was prepared by PVD method on the n-type doped amorphous silicon (thickness: 10 nm) on the back side of the silicon wafer. A bottom silicon-based heterojunction cell was made by the above process.

$SnO_2$ (10 nm) was deposited by atomic layer deposition, and then C60 (5 nm) was prepared by evaporation. A perovskite layer (400 nm) was prepared by spin coating. For preparing a $MAPbI_3$ film, firstly, $PbI_2$ and $CH_3NH_3I$ were dissolved in a solvent at a molar ratio of 1:1 to prepare a perovskite precursor solution, where the solvent was a mixed solution of dimethyl sulfoxide (DMSO) and DMF, and the volume ratio of DMSO to DMF was 1:4; then, the perovskite precursor solution was used for spin coating, where the spin-coating parameters were as follows: rotation speed of 5000 rpm and time of 30 seconds, and 0.3 ml of an anti-solvent (chlorobenzene or ether) was dropwise added at 10 seconds; and finally, the substrate was placed on a heating platform at 100° C., and annealed for 10 minutes to prepare a perovskite absorber layer with a thickness of 400 nm; and a hole transport layer PTAA with a thickness of 50 nm was prepared by spin coating. A NiO layer with a thickness of 10 nm was prepared by ALD. A silver electrode was prepared by high-vacuum thermal evaporation process, and uniformly evaporated on the hole transport layer at a speed of 2 Å/s while rotating the substrate, with a thickness of 200 nm.

Example 2

Preparation of a p-i-n Perovskite/Silicon Heterojunction Tandem Cell

Firstly, an N-type silicon wafer of commercial-grade M6, having a resistivity of 1-10 Ω·cm and a thickness of 150-200 μm, was used. The N-type silicon wafer was subjected to polishing, texturing and cleaning treatments sequentially, and an intrinsic amorphous silicon passivation layer (thickness: 5 nm) was deposited on both sides of the silicon wafer by PECVD, a doped (doping concentration: $10^{19-20}$ $cm^{-3}$) p-type heavily-doped amorphous silicon (thickness: 10 nm) was prepared on the back side of the silicon wafer, a doped (doping concentration: $10^{19-20}$ $cm^3$) n-type heavily-doped amorphous silicon (thickness: 10 nm) and p-type heavily-doped amorphous silicon (thickness: 10 nm) were prepared on the front side of the silicon wafer so as to form a tunnel junction, and ITO (100 nm) was prepared by PVD method on the p-type doped amorphous silicon (thickness: 10 nm) on the back side of the silicon wafer. A bottom silicon-based heterojunction cell was made by the above process.

NiO (10 nm) was deposited by atomic layer deposition, and then Spiro-TFB (5 nm) was prepared by evaporation. A perovskite layer (400 nm) was prepared by spin coating. A perovskite $Cs_{0.15}FA_{0.85}PbI_{2.5}Br_{0.5}$ film was prepared, where a solvent was a mixed solution of dimethyl sulfoxide (DMSO) and DMF, and the volume ratio of DMSO to DMF was 1:5; then, the perovskite precursor solution was used for spin coating, where the spin-coating parameters were as follows: rotation speed of 5000 rpm and time of 30 seconds, and 0.3 ml of an anti-solvent (chlorobenzene or ether) was dropwise added at 10 seconds; and finally, the substrate was placed on a heating platform at 100° C., and annealed for 30 minutes to prepare a perovskite absorber layer with a thickness of 500 nm; and an electron transport layer C60 with a thickness of 30 nm was prepared by evaporation. A $SnO_2$ layer with a thickness of 10 nm was prepared by ALD. A silver electrode was prepared by high-vacuum thermal evaporation process, and uniformly evaporated on the hole transport layer at a speed of 2 Å/s while rotating the substrate, with a thickness of 200 nm.

Example 3

This example was different from Example 1 in that: the silver electrode in Example 1 was replaced with a nickel electrode and ITO was replaced with IZO, and the rest remained unchanged.

Example 4

This example was different from Example 2 in that: the silver electrode in Example 2 was replaced with a chromium electrode and ITO was replaced with IWO, and the rest remained unchanged.

Comparative Example 1

Preparation of an n-i-p Perovskite/Silicon Heterojunction Tandem Cell

Firstly, an N-type silicon wafer of commercial-grade M6, having a resistivity of 1-10 Ω·cm and a thickness of 150-200 μm, was used. The N-type silicon wafer was subjected to polishing, texturing and cleaning treatments sequentially, and an intrinsic amorphous silicon passivation layer (thickness: 5 nm) was deposited on both sides of the silicon wafer by PECVD, a doped n-type doped amorphous silicon (thickness: 10 nm) was prepared on the back side of the silicon wafer, a doped p-type doped amorphous silicon (thickness: 10 nm) was prepared on the front side of the silicon wafer, and ITO (100 nm) was plated by PVD on the doped p-type doped amorphous silicon prepared on the front side of the silicon wafer. A bottom silicon-based heterojunction cell was made by the above process.

$SnO_2$ (10 nm) was deposited by atomic layer deposition, and then C60 (5 nm) was prepared by evaporation. A perovskite layer (400 nm) was prepared by spin coating. For preparing a $MAPbI_3$ film, firstly, $PbI_2$ and $CH_3NH_3I$ were dissolved in a solvent at a molar ratio of 1:1 to prepare a perovskite precursor solution, where the solvent was a mixed solution of dimethyl sulfoxide (DMSO) and DMF, and the volume ratio of DMSO to DMF was 1:4; then, the perovskite precursor solution was used for spin coating, where the spin-coating parameters were as follows: rotation speed of 5000 rpm and time of 30 seconds, and 0.3 ml of an anti-solvent (chlorobenzene or ether) was dropwise added at 10 seconds; and finally, the substrate was placed on a heating platform at 100° C., and annealed for 10 minutes to prepare a perovskite absorber layer with a thickness of 400 nm; and a hole transport layer PTAA with a thickness of 50 nm was prepared by spin coating. A NiO layer with a thickness of 10 nm was prepared by ALD. A silver electrode was prepared by high-vacuum thermal evaporation process, and uniformly evaporated on the hole transport layer at a speed of 2 Å/s while rotating the substrate, with a thickness of 200 nm.

Comparative Example 2

Preparation of a p-i-n Perovskite/Silicon Heterojunction Tandem Cell

Firstly, an N-type silicon wafer of commercial-grade M6, having a resistivity of 1-10 Ω·cm and a thickness of 150-200 μm, was used. The N-type silicon wafer was subjected to polishing, texturing and cleaning treatments sequentially, and an intrinsic amorphous silicon passivation layer (thickness: 5 nm) was deposited on both sides of the silicon wafer by PECVD, a doped p-type doped amorphous silicon (thickness: 10 nm) was prepared on the back side of the silicon wafer, a doped n-type doped amorphous silicon (thickness: 10 nm) was prepared on the front side of the silicon wafer, and ITO (100 nm) was plated by PVD on the n-type doped amorphous silicon prepared on the front side of the silicon wafer. A bottom silicon-based heterojunction cell was made by the above process.

NiO (10 nm) was deposited by atomic layer deposition, and then Spiro-TFB (5 nm) was prepared by evaporation. A perovskite layer (400 nm) was prepared by spin coating. A perovskite $Cs_{0.15}FA_{0.85}PbI_{2.5}Br_{0.5}$ film was prepared, where a solvent was a mixed solution of dimethyl sulfoxide (DMSO) and DMF, and the volume ratio of DMSO to DMF was 1:5; then, the perovskite precursor solution was used for spin coating, where the spin-coating parameters were as follows: rotation speed of 5000 rpm and time of 30 seconds, and 0.3 ml of an anti-solvent (chlorobenzene or ether) was dropwise added at 10 seconds; and finally, the substrate was placed on a heating platform at 100° C., and annealed for 30 minutes to prepare a perovskite absorber layer with a thickness of 500 nm; and an electron transport layer C60 with a thickness of 30 nm was prepared by evaporation. A SnO$_2$ layer with a thickness of 10 nm was prepared by ALD. A silver electrode was prepared by high-vacuum thermal evaporation process, and uniformly evaporated on the hole transport layer at a speed of 2 Å/s while rotating the substrate, with a thickness of 200 nm.

The photocurrent density and conversion efficiency tests were carried out on Examples 1-4 and Comparative Examples 1-2, and the results are shown in Table 1.

TABLE 1

Test results of photocurrent density and conversion efficiency

| | Short-circuit current density/(mA cm$^{-2}$) | Open circuit voltage/V | Fill factor | Efficiency |
|---|---|---|---|---|
| Comparative Example 1 | 17.8 | 1.86 | 0.76 | 25.2% |
| Example 1 | 19.0 | 1.92 | 0.78 | 28.7% |
| Comparative Example 2 | 17.7 | 1.85 | 0.76 | 24.8% |
| Example 2 | 19.1 | 1.92 | 0.79 | 29.1% |
| Example 3 | 18.8 | 1.90 | 0.78 | 27.8% |
| Example 4 | 18.9 | 1.91 | 0.77 | 27.8% |

The test results show that the photocurrent density and conversion efficiency of the tandem cells can be better improved by using the p-type heavily-doped amorphous silicon layer and the n-type heavily-doped amorphous silicon layer as carrier recombination junctions.

Those of ordinary skill in the art should understand that: the discussion of any of the above embodiments is only exemplary, and is not intended to imply that the scope of the present invention (including the claims) is limited to these examples; and under the spirit of the present invention, technical features in the above embodiments or different embodiments may also be combined, steps may be carried out in any order, and there are many other variations of the different aspects of the present invention as described above, which are not provided in detail for the sake of brevity.

The present invention is intended to cover all such alternatives, modifications and variations that fall within the broad scope of the appended claims. Therefore, any omissions, modifications, equivalent replacements, improvements, etc. made within the spirit and principle of the present invention shall be included within the scope of protection of the present invention.

What is claimed is:

1. A perovskite/silicon heterojunction tandem solar cell, consisting of a silicon-based sub-cell, a perovskite sub-cell laminated on the silicon-based sub-cell, and intermediate layers or recombination junctions arranged between the silicon-based sub-cell and the perovskite sub-cell, wherein the intermediate layers or the recombination junctions are formed by a p-type heavily-doped amorphous silicon layer and an n-type heavily-doped amorphous silicon layer, the p-type heavily-doped amorphous silicon layer has a thickness of 1-30 nm and a doping concentration of $10^{18}$-$10^{20}$ cm$^{-3}$; and the n-type heavily-doped amorphous silicon layer has a thickness of 1-30 nm and a doping concentration of $10^{19}$-$10^{20}$ cm$^{-3}$, the tandem solar cell is of an n-i-p tandem structure in which the silicon-based sub-cell consists of a first metal electrode, a first transparent conductive layer, an n-type doped amorphous silicon layer, a first intrinsic amorphous silicon layer, an N-type monocrystalline silicon layer and a second intrinsic amorphous silicon layer that are laminated sequentially from bottom to top, the perovskite sub-cell consists of a first electron transport layer, a second electron transport layer, a perovskite absorber layer, a first hole transport layer, a second hole transport layer, a second transparent conductive layer and a second metal electrode layer that are laminated sequentially from bottom to top, and the intermediate layers or the recombination junctions are the p-type heavily-doped amorphous silicon layer and the n-type heavily-doped amorphous silicon layer that are laminated between the second intrinsic amorphous silicon layer and the first electron transport layer sequentially from bottom to top; or the tandem solar cell is of a p-i-n tandem structure in which the silicon-based sub-cell consists of a first metal electrode, a first transparent conductive layer, a p-type doped amorphous silicon layer, a first intrinsic amorphous silicon layer, an N-type monocrystalline silicon layer and a second intrinsic amorphous silicon layer that are laminated sequentially from bottom to top, the perovskite sub-cell consists of a first hole transport layer, a second hole transport layer, a perovskite absorber layer, a first electron transport layer, a second electron transport layer, a second transparent conductive layer and a second metal electrode layer that are laminated sequentially from bottom to top, and the intermediate layers or the recombination junctions are the n-type heavily-doped amorphous silicon layer and the p-type heavily-doped amorphous silicon layer that are laminated between the second intrinsic amorphous silicon layer and the first hole transport layer sequentially from bottom to top, wherein the first hole transport layer is made of one or more of nickel oxide, molybdenum oxide, cuprous oxide, copper iodide, copper phthalocyanine, cuprous thiocyanate, reduced graphene oxide, poly[bis(4-phenyl)(2,4,6-trimethylphenyl)amine] PTAA), 2,2',7,7'-tetrakis[N,N-di(4-methoxyphenyl)amino]-9,9'-spirobifluorene (Spiro-OMeTAD), poly[bis(4-phenyl)(4-butylphenyl)amine] (Poly-TPD), poly(3-hexylthiophene-2,5-diyl) (P3HT), N2,N2,N2',N2',N7,N7,N7',N7'-octa(4-methoxyphenyl)spiro[fluorene-9,9'-xanthene]-2,2', 7,7'-tetraamine (X60), N2,N7-bis(4-methoxyphenyl)-N2,N7-bis(2-spiro[fluorene-9,9'-xanthene])-spiro[fluorene-9,9'-xanthene]-2,7-diamine (X55), poly(3,4-ethylenedioxythiophene)-poly(styrenesulfonate) (PEDOT:PSS), 2,2,7,7-tetrakis(N,N-di-p-tolyl)amino-9,9-spirobifluorene (Spiro-TTB), and polyvinylcarbazole (PVK), wherein when the tandem solar cell is of the p-i-n tandem structure, the first hole transport layer contacts the intermediate layers or the recombination junctions.

2. The perovskite/silicon heterojunction tandem solar cell according to claim 1, wherein the first metal electrode and the second metal electrode are made of one or more of silver, copper, gold, aluminum, palladium, titanium, chromium, and nickel; and the first transparent conductive layer and the second transparent conductive layer are both transparent metal oxide conductive layers made of one or more of indium tin oxide, indium wolfram oxide, fluorine-doped tin oxide, indium zinc oxide and aluminum-doped zinc oxide.

3. The perovskite/silicon heterojunction tandem solar cell according to claim 1, wherein the second hole transport layer is made of a p-type semiconductor material; and the first electron transport layer and/or the second electron transport layer is made of an n-type semiconductor material.

4. The perovskite/silicon heterojunction tandem solar cell according to claim 1, wherein a material of the perovskite absorber layer is of an $ABX_3$ structure consisting of corner-sharing $BX_6$ octahedra and A cations located in voids thereof, where A is a monovalent cation; B is a divalent cation; and X is a halogen anion.

\* \* \* \* \*